United States Patent
Yamaguchi et al.

(10) Patent No.: US 7,834,739 B2
(45) Date of Patent: Nov. 16, 2010

(54) BAGGAGE MANAGEMENT GATE

(75) Inventors: Shoji Yamaguchi, Kanagawa (JP); Mario Fuse, Kanagawa (JP); Yasunori Koda, Kanagawa (JP); Kunihiro Takahashi, Kanagawa (JP); Hiroyoshi Inoue, Kanagawa (JP); Tsukasa Matsuda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 458 days.

(21) Appl. No.: 12/076,337

(22) Filed: Mar. 17, 2008

(65) Prior Publication Data

US 2009/0072979 A1 Mar. 19, 2009

(30) Foreign Application Priority Data

Sep. 19, 2007 (JP) .............................. 2007-242491

(51) Int. Cl.
*B60R 25/00* (2006.01)
*G06F 7/04* (2006.01)
*G06F 7/00* (2006.01)

(52) U.S. Cl. .................. 340/5.8; 340/5.7; 340/5.81; 700/228; 700/229

(58) Field of Classification Search ........................ None
See application file for complete search history.

(56) References Cited

U.S. PATENT DOCUMENTS

| | | | | | |
|---|---|---|---|---|---|
| 4,481,887 | A | * | 11/1984 | Urbano | 109/3 |
| 4,583,083 | A | * | 4/1986 | Bogasky | 340/572.1 |
| 5,600,303 | A | * | 2/1997 | Husseiny et al. | 340/568.1 |
| 6,484,650 | B1 | * | 11/2002 | Stomski | 109/6 |
| 2003/0136837 | A1 | * | 7/2003 | Amon et al. | 235/435 |

FOREIGN PATENT DOCUMENTS

JP    A 2003-182847    7/2003

* cited by examiner

*Primary Examiner*—Daniel Wu
*Assistant Examiner*—Mark Rushing
(74) *Attorney, Agent, or Firm*—Oliff & Berridge, PLC

(57) ABSTRACT

A baggage management gate includes a first reading device and a second reading device, a detecting device, a determining unit, a first opening and closing device and a second opening and closing device. The baggage management gate manages baggage that is restricted to be carried in or out from a predetermined region. And in order away from the region in which the baggage is managed, the first reading device, the second opening and closing device, the detecting device for both the first person and the second person, the first opening and closing device, and the second reading device are arranged in an entrance direction from the passage to the management region in which the baggage is managed.

9 Claims, 2 Drawing Sheets

BAGGAGE MANAGEMENT GATE

CROSS-REFERENCE TO RELATED APPLICATIONS

This application is based on and claims priority under 35 USC 119 from Japanese Patent Application No. 2007-242491 filed Sep. 19, 2007.

BACKGROUND

1. Technical Field

The present invention relates to a baggage management gate that detects a variation in a magnetic field due to magnetization reversal of a magnetic material showing a large Barkhausen effect and manages baggage that is restricted to be carried in or out from a predetermined region.

2. Related Art

For example, it is known that a baggage management gate that detects passage of baggage that is prohibited to be carried in or out, using a magnetic material showing a large Barkhausen effect, and issues an alarm.

A soft magnetic material, such as a Fe—Co-based amorphous metal wire, has been known as the magnetic material showing the large Barkhausen effect. When an alternating magnetic field stronger than a coercive force is applied to the magnetic material, the magnetization of the magnetic material is rapidly reversed, which results in a variation in the magnetic field. When the magnetic material showing the large Barkhausen effect is added to objects that are restricted to be carried in or out and the alternating magnetic field is generated in a passage through which the objects pass, it is possible to detect the movement of the objects through a predetermined passage by detecting the variation in the magnetic field.

The baggage management gate can be installed in, for example, an entrance of a management region in which objects that are prohibited to be carried in or out is managed.

SUMMARY

According to an aspect of the invention, a baggage management gate includes a first reading device, a second reading device, a detecting device, a determining unit, a first opening and closing device, and a second opening and closing device. The first reading device reads personal information of the first person who passes through a passage to enter to a management region in which baggage is managed. The second reading device reads personal information of the second person who passes through the passage to exit from the management region in which the baggage is managed. The detecting device generates an alternating magnetic field in the passage and detects a variation in the alternating magnetic field when magnetization reversal occurs in a magnetic material due to a large Barkhausen effect in the alternating magnetic field. The determining unit determines as to whether the first person is allowed to pass through the passage, based on information indicating the detection signal by the detecting device and information transmitted from the first reading device. The determining unit determines as to whether the second person is allowed to pass through the passage, based on information indicating the detection signal by the detecting device and information transmitted from the second reading device. The first opening and closing device for the first person opens or closes the passage based on a result as to the first person determined by the determining unit. The second opening and closing device for the exiting person opens or closes the passage based on a result as to the second person determined by the determining unit. And in order away from the region in which the baggage is managed, (i) the first reading device, (ii) the second opening and closing device, (iii) the detecting device for both the first person and the second person, (iv) the first opening and closing device, and (v) the second reading device are arranged in an entrance direction from the passage to the management region in which the baggage is managed.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the invention will be described with reference to the accompanying drawings.

Figure 1A:
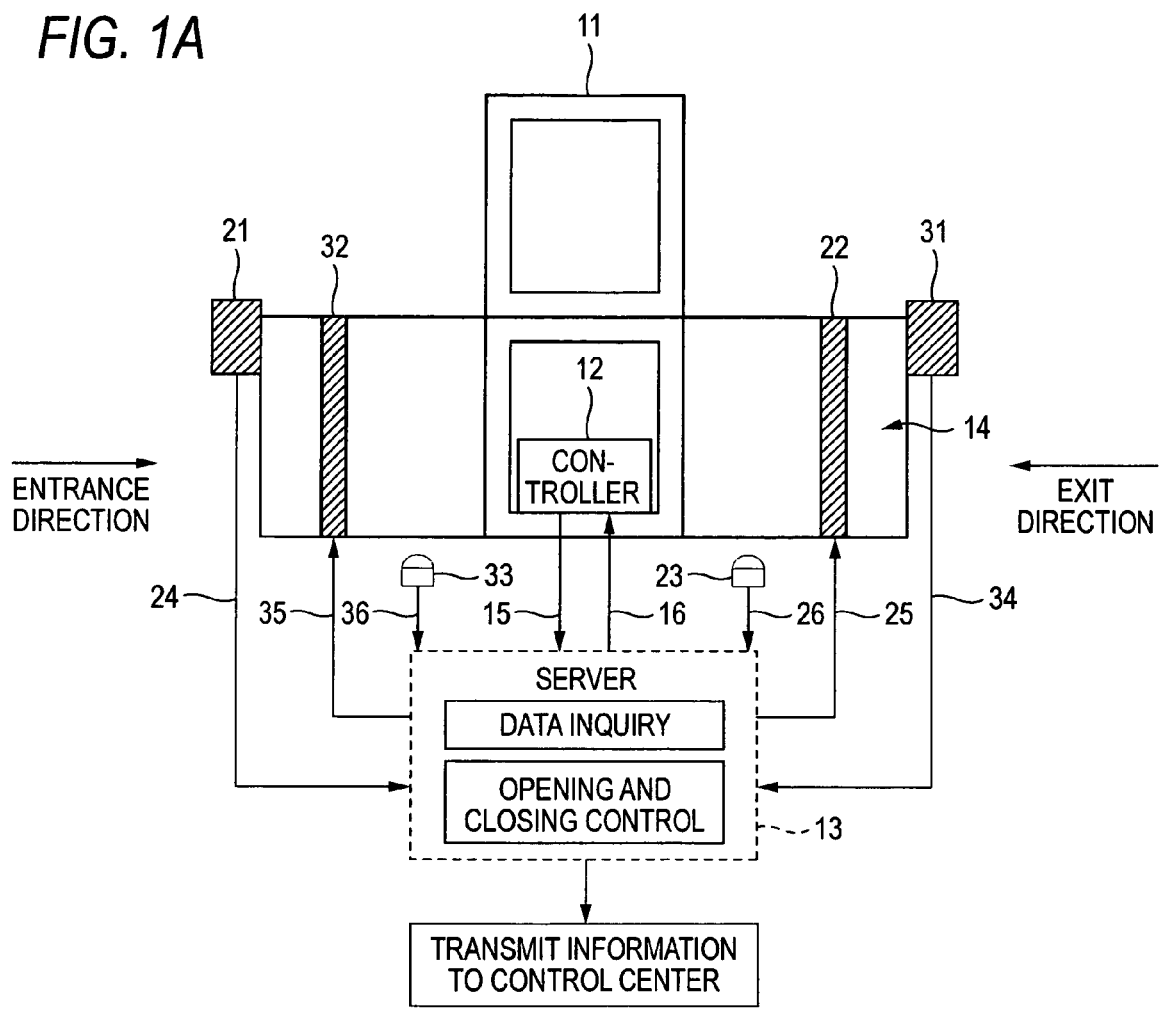
FIG. 1A is a schematic diagram illustrating the structure of a baggage management gate according to an exemplary embodiment of the invention.
Figure 1B:
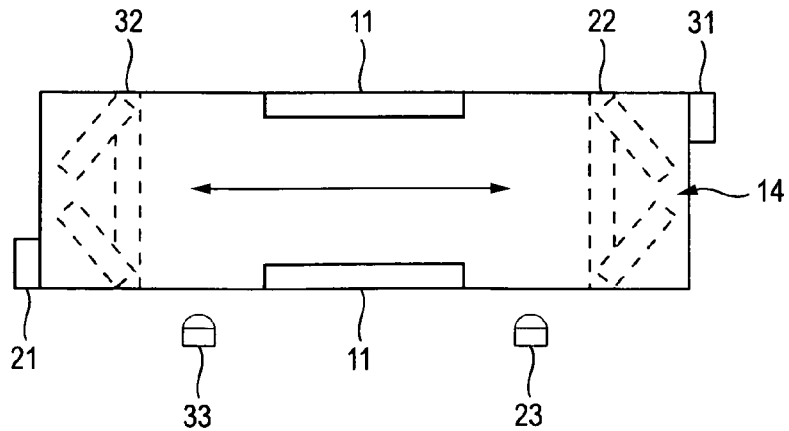
FIG. 1B is a plan view illustrating the structure of the baggage management gate according to the exemplary embodiment of the invention.

FIG. 1A is a schematic diagram and FIG. 1B is a plan view. FIG. 1A and FIG. 1B illustrate the structure of a baggage management gate that is installed in an entrance of a management region which predetermined objects are restricted to be carried in or out from.

The baggage management gate is provided to face a passage 14 to the management region, and includes: an entering person information reading device 21, an exiting person information reading device 31, a magnetic field variation detecting device 11, a controller 12, an entering person motion sensor 23, an exiting person motion sensor 33, a server 13, and an opening and closing device 22. The entering person information reading device 21 and the exiting person information device read personal information of person. The magnetic field variation detecting device 11 for both an entering person and an exiting person forms an alternating magnetic field in the passage 14 and detects a magnetic material showing a large Barkhausen effect. The controller 12 controls the magnetic field variation detecting device. The entering person motion sensor 23 and the exiting person motion sensor 33 are provided on the downstream sides of the magnetic field variation detecting device in the direction in which the persons move. The server 13 for both an entering person and an exiting person determines whether to allow the person to pass through based on information acquired by the entering and exiting person information reading devices 21 and 31, the magnetic field variation detecting device 11, and the motion sensors 23 and 33. The opening and closing device 22 for an entering person and an opening and closing device 32 for an exiting person close or open the passage 14 based on the result determined by the server 13. In order away from the management region, the entering person information reading device 21, the opening and closing device 32 for an exiting person, the magnetic field variation detecting device 11 for both an entering person and an exiting person, the opening and closing device 22 for an entering person, and the exiting person information reading device 31 are arranged in the entrance direction from the passage 14 to the management region.

The entering person information reading device 21 and the exiting person information reading device 31 read out information contained in magnetic cards or IC cards held by the persons. In this case, general information reading methods, such as a card contact method and an electromagnetic wave radiation method, can be used to read information. In order to determine whether to allow the persons to pass through, only identification information of persons may be read, and the read information may be compared with personal information stored in the server beforehand. Alternatively, detailed information indicating whether to allow the persons to pass through may be read from the magnetic cards or the IC cards.

Further, in addition to the magnetic cards and the IC cards, bio identification systems that read fingerprints or vein shapes may be used to identify the persons.

The magnetic field variation detecting device 11 includes an exciting coil and a detecting coil. The exciting coil generates an alternating magnetic field in the passage 14 to the management region in which baggage is managed. The detecting coil detects magnetization reversal due to a large Barkhausen effect generated when a magnetic material passes through the alternating magnetic field. The exciting coil and the detecting coil are wound along a vertical plane that is parallel to the direction in which the persons move in the passage, and are accommodated in one case. Therefore, the case having the exciting coil and the detecting coil accommodated therein is provided on one side or both sides of the passage so as to detect the passage of the magnetic material, regardless of the position where the magnetic material showing the large Barkhausen effect passes through the passage. The controller 12 controls the operation of the magnetic field variation detecting device by, for example, applying an AC voltage to the exciting coil.

The entering person motion sensor 23 and the exiting person motion sensor 33 are provided at both sides in the entrance direction and the exit direction between the magnetic field variation detecting device 11 and the management region. Specifically, the entering person motion sensor 23 is provided on the downstream side of the magnetic field variation detecting device 11 in the entrance direction to the management region, and the exiting person motion sensor 33 is provided on the downstream side of the magnetic field variation detecting device 11 in the exit direction from the management region. When the motion sensors 23 and 33 detect the passage of the person, they transmit detection signals to the server 13. The sensors can detect the passage of the person by detecting a variation in the amount of light reflected from a target object, by detecting the shielding of light at a predetermined position and the like.

The opening and closing device 22 for an entering person and the opening and closing device 32 for an exiting person function to operate members for opening or closing the passing of the person, for example, gates. The opening and closing devices 22 and 32 are controlled based on the result determined by the server 13 to restrict the passage of the person or alert the person.

The server 13 matches (i) personal information detected by the entering person information reading device 21 or the exiting person information reading device 31 and (ii) information of the magnetic material detected by the magnetic field variation detecting device 11 for both an entering person and an exiting person with predetermined information as shown in Table 1 to control the opening and closing devices 22 and 32 which open or close the passage. For example, as shown in (a) and (b) of Table 1, only the personal information of the persons may be used to determine whether to pass the persons. Further, as shown in (c) to (g) of Table 1, when any one of personal information, detection information of the magnetic material, place information and time information indicates not to allow the person (NG), the passage may be blocked. That is, setting can be selected according to security levels. Here, time information is such as a time when the server 13 obtains the personal information, and a time when the server 13 obtains information indicating the detection signal. And place information means information indicating installation position of the baggage management (a given gate number, for example). When a person enters the management region together with a person who doesn't access the entering and exiting person information reading devices 21 and 31, the server compares entrance data with exit data, and controls the operation of the opening and closing devices 22 and 32 on the based on the result of the comparison.

TABLE 1

|     | Person | Time | Place | Magnetic material | Closing and opening device |
| --- | --- | --- | --- | --- | --- |
| (a) | OK | — | — | — | Open |
| (b) | NG | — | — | — | Close |
| (c) | OK | OK | OK | Absent OK | Open |
| (d) | OK | OK | OK | Present NG | Close |
| (e) | NG | OK | OK | Absent OK | Close |
| (f) | OK | NG | OK | Absent OK | Close |
| (g) | OK | OK | NG | Absent OK | Close |

In addition, personal information is associated with information indicating detection of a large Barkhausen signal, based on information detected by the entering person motion sensor 23 or the exiting person motion sensor 33 and the timing when the large Barkhausen signal is detected. That is, when the large Barkhausen signal is detected within the period from the input of personal information to the detection of information by the motion sensor, the passing of the person is determined based on associating the information indicating the detection of the large Barkhausen signal with the personal information that is most recently input. Meanwhile, when the large Barkhausen signal is not detected within the period from the input of personal information to the detection of information by the motion sensor, the detection of the person whose personal information which has been most recently input ends. In this way, it is possible to prevent erroneous operations by associating the detection information of a magnetic material with personal information of the previous person when a person having the magnetic material follows the previous person without the magnetic material.

When a person who is not allowed to pass through enters the management region, the server 13 may be configured to notify this information to an administrator. The notification may be performed by, for example, turning on a lamp, outputting an alert sound, or sending an email. All the detection information may be stored in a storage device.

Next, the operation of the baggage management gate will be described below.

When there is a person who wants to pass through the baggage management gate to enter the management region, the entering person information reading device 21 requires the person to input his or her personal information. Personal information 24 of the entering person acquired by the entering person information reading device 21 is transmitted to the server 13, and the magnetic field variation detecting device 11 for both an entering person and an exiting person transmits, to the server 13, information indicating a detection signal 15 detected due to a variation in the magnetic field.

When the server 13 acquires the information indicating the detection signal 15 after acquiring the personal information 24 and before acquiring information indicating a detection signal 26 from the entering person motion sensor 23, the server 13 associates the information indicating the detection signal 15 with personal information that is most recently acquired from the entering person information reading device 21, and the server 13 determines whether to allow the person to pass through the passage based on data stored in the storage device beforehand. When the person is allowed, the detection operation ends. When the passage is not allowed, an operation signal 25 is transmitted to the opening and closing device 22 for an entering person to immediately close the gate. In this way, the passage of the person is restricted, or the person is warned against the passage. In addition, an alert lamp (not shown) is turned on and this is notified to the administrator.

Meanwhile, when the server 13 doesn't acquire the information of the detection signal 15 after acquiring the personal information 24 and before acquiring the information indicating the detection signal 26 from the entering person motion sensor 23, the server 13 ends the detection of the person whose personal information has been most recently input without operating the opening and closing device 22 for an entering person. When the server 13 acquires information indicating a detection signal 26 from the entering person motion sensor 23 and then acquires information indicating a detection signal 15, the server 13 determines whether to pass the person associating the information indicating the detection signal 15 with personal information of the next person acquired from the entering person information reading device 21.

When there is a person in the exit direction from the management region, the exiting person information reading device 31, the magnetic field variation detecting device 11, the opening and closing device 32 for an exiting person, and the exiting person motion sensor 33 are operated in the same manner as described above, thereby managing baggage of the person who exits from the management region. Specifically, When the server 13 acquires the information indicating the detection signal 15 after acquiring the personal information 34 and before acquiring information indicating a detection signal 36 from the exiting person motion sensor 33, the server 13 associates the information indicating the detection signal 15 with personal information that is most recently acquired from the exiting person information reading device 31, and the server 13 determines whether to allow the person to pass through the passage based on data stored in the storage device beforehand. When the person is allowed, the detection operation ends. When the passage is not allowed, an operation signal 35 is transmitted to the opening and closing device 32 for an entering person to immediately close the gate. In this way, the passage of the person is restricted, or the person is warned against the passage. In addition, the alert lamp (not shown) is turned on and this is notified to the administrator.

Meanwhile, when the server 13 doesn't acquire the information of the detection signal 15 after acquiring the personal information 34 and before acquiring the information indicating the detection signal 36 from the entering person motion sensor 33, the server 13 ends the detection of the person whose personal information has been most recently input without operating the opening and closing device 32 for an entering person.

In the baggage management gate, the entering person motion sensor 23 and the exiting person motion sensor 33 are used, but control may be performed without using these motion sensors. In this case, when the large Barkhausen signal is detected within a predetermined time period after personal information is input, information of the detection signal is associated with the personal information that is previously input to determine whether to allow the passage of the person. When the large Barkhausen signal is not detected within the predetermined time period after personal information is input and personal information of the next person is input, it is determined that the previous person does not have baggage including a magnetic material showing the large Barkhausen effect, and the detection of the previous person ends. Then, the large Barkhausen signal detected from a magnetic material of the baggage of the next person is associated with personal information of the next person.

Figure 2:
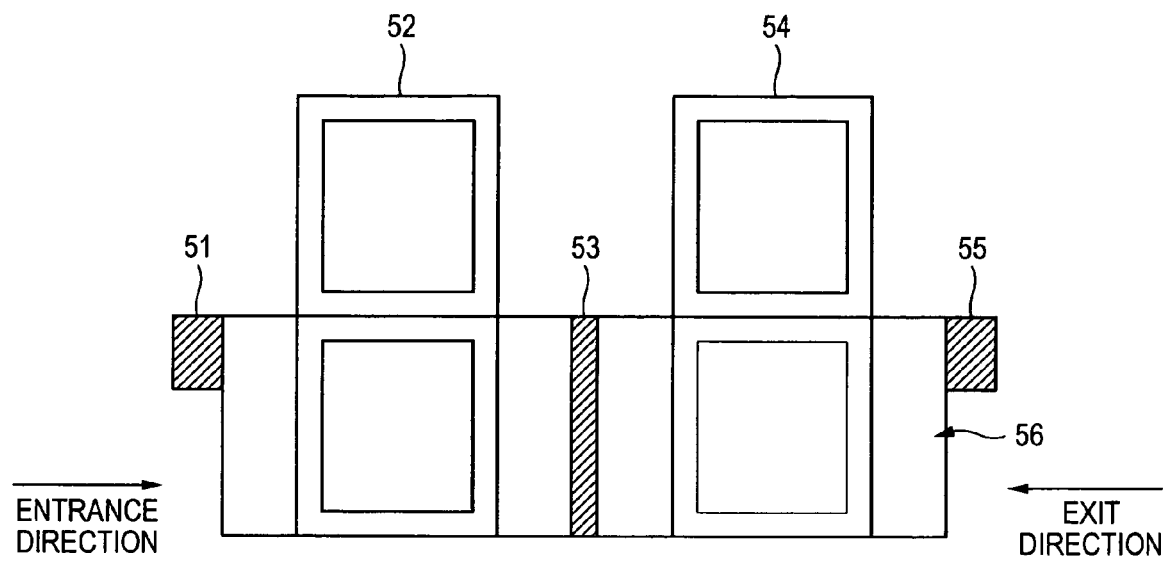
FIG. 2 is a diagram schematically illustrating the structure of a baggage management gate according to another embodiment of the invention.

FIG. 2 is a diagram schematically illustrating the structure of a baggage management gate according to another embodiment of the invention.

The baggage management gate includes an entering person information reading device 51, an exiting person information reading device 55, a magnetic field variation detecting device 52, a magnetic field variation detecting device 54 and an opening and closing device 53. The entering person information reading device 51 and the exiting person information reading device 55 that are provided in a passage 56 to a management region and read personal information of persons. The magnetic field variation detecting device 52 for an entering person and a magnetic field variation detecting device 54 for an exiting person that generate an alternating magnetic field in the passage 56 and detect a magnetic material showing the large Barkhausen effect. The opening and closing device 53 for both an entering person and an exiting person that closes or opens the passage 56. In order away from the management region, the entering person information reading device 51, the magnetic field variation detecting device 52 for an entering person, the opening and closing device 53 for both an entering person and an exiting person, the magnetic field variation detecting device 54 for an exiting person, and the exiting person information reading device 55 are arranged in the entrance direction from the passage 56 to the management region.

That is, in the baggage management gate, the closing and opening device 53 is common to an entering person and an exiting person. The magnetic field variation detecting devices 52 and 54 for an entering person and an exiting person are separately provided. And the magnetic field variation detecting device 52 and 54 are controlled by a controller. Also, entering person motion sensor and exiting person motion sensor may be provided in a similar way of the exemplary embodiment. For example, the entering person motion sensor is provided on the downstream side of the magnetic field variation detecting device 52 in the entrance direction to the management region, and the exiting person motion sensor 33 is provided on the downstream side of the magnetic field variation detecting device 54 in the exit direction from the management region.

In the baggage management gate, it is also possible to manage person's belongings that are carried in or out by accurately associating personal information of person who enter or exit from the management region with the large Barkhausen signals to determine whether to allow the passage of the person.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A baggage management gate comprising:
   a first reading device that reads personal information of a first person who passes through a passage to enter to a management region in which baggage is managed;
   a second reading device that reads personal information of a second person who passes through the passage to exit from the management region in which the baggage is managed;
   a detecting device that generates an alternating magnetic field in the passage and detects a variation in the alternating magnetic field when magnetization reversal occurs in a magnetic material due to a large Barkhausen effect in the alternating magnetic field;
   a determining unit that determines as to whether the first person is allowed to pass through the passage, based on information indicating the detection signal by the detecting device and information obtained from the first reading device, and
   the determining unit that determines as to whether the second person is allowed to pass through the passage, based on information indicating the detection signal by the detecting device and information obtained from the second reading device;
   a first opening and closing device for the first person, that opens or closes the passage based on a result as to the first person determined by the determining unit;
   a second opening and closing device for the second person, that opens or closes the passage based on a result as to the second person determined by the determining unit; and
   wherein in order away from the region in which the baggage is managed, (i) the first reading device, (ii) the second opening and closing device, (iii) the detecting device for both the first person and the second person, (iv) the first opening and closing device, and (v) the second reading device are arranged in an entrance direction from the passage to the management region in which the baggage is managed.

2. The baggage management gate according to claim 1 further comprising:
   a first sensor that is provided in the passage on a downstream side of the detecting device in the entrance direction to the management region in which the baggage is managed and detects the passing of the first person; and
   a second sensor that is provided in the passage on a downstream side of the detecting device in an exit direction from the management region in which the baggage is managed and detects the passing of the second person; and
   wherein the determining unit associates information indicating a first signal detected by the detecting device with the information read by the first reading device, thereby determining as to whether the first person is allowed to pass through the passage or not, and
   the first signal is detected within a period from the reading of the personal information by the first reading device to the detection of the first person by the first sensor, and
   wherein the determining unit associates information indicating a second signal detected by the detecting device with the information read by the second reading device, thereby determining as to whether the second person is allowed to pass through the passage or not, and
   the second signal is detected within a period from the reading of the personal information by the second reading device to the detection of the second person by the second sensor.

3. A baggage management gate comprising:
   a first reading device that reads personal information of a first person who passes through a passage to enter to a management region in which baggage is managed;
   a second reading device that reads personal information of a second person who passes through the passage to exit from the management region in which the baggage is managed;
   a first detecting device for the first person, that generates a first alternating magnetic field in the passage and detects a variation in the first alternating magnetic field when magnetization reversal occurs in a magnetic material due to a large Barkhausen effect in the first alternating magnetic field;
   a second detecting device for a second person, that generates an second alternating magnetic field in the passage and detect a variation in the second alternating magnetic field when magnetization reversal occurs in the magnetic material due to a large Barkhausen effect in the second alternating magnetic field;
   a determining unit that determines as to whether the first person are allowed to pass through the passage based on information transmitted from the first reading device and information indicating a detection signal by the first detecting device, and
   the determining unit that determines as to whether the second person are allowed to pass through the passage based on information transmitted from the second reading device and information indicating a detection signal by the second detecting device; and
   an opening and closing device for both the first person and the second person that opens or closes the passage based on a result determined by the determining unit,
   wherein in order away from the region in which the baggage is managed, (i) the first reading device, (ii) the first detecting device, (iii) the opening and closing device for both the first person and the second person, (iv) the second detecting device, and (v) the second reading device are arranged in an entrance direction from the passage to the management region in which the baggage is managed.

4. The baggage management gate according to claim 3, further comprising:
   a first sensor that is provided in the passage on a downstream side of the first detecting device in the entrance direction to the management region in which the baggage is managed and detects passing of the first person; and
   a second sensor that is provided in the passage on a downstream side of the second detecting device in an exit direction from the management region in which the baggage is managed and detects the passing of the second person, and
   wherein the determining unit associates information indicating a first signal detected by the first detecting device with the information read by the first reading device, thereby determining as to whether the first person is allowed to pass through the passage or not, and the first signal is detected within a period from the reading of the personal information by the first reading device to the detection of the passing of the first person by the first sensor, and wherein the determining unit associates information indicating a second signal detected by the second detecting device with the information read by the second reading device, thereby determining as to whether the second person is allowed to pass through the passage or not, and the second signal is detected within a period from the reading of the personal information by the second reading device to the detection of the passing of the second person by the second sensor.

5. The baggage management gate according to claims 1, wherein the determining unit includes a clock, and the determining unit determines as to whether the first person is allowed to enter the management region based on information acquired from the clock when the first person passes through the baggage management gate in addition to the information indicating the detection signal obtained from detecting device, and the information obtained from the first reading device, and the determining unit determines as to whether the second person is allowed to exit the management region based on information acquired from the clock when the second person passes through the baggage management gate in addition to the information indicating the detection signal obtained from detecting device, and the information obtained from the second reading device.

6. A baggage management method comprising:

a baggage entering management method comprising:

reading, by a first reading device, personal information of a first person who passes through a passage to enter to a management region in which baggage is managed;

generating, by a detecting device, an alternating magnetic field in the passage and detecting a variation in the alternating magnetic field when magnetization reversal occurs in a magnetic material due to a large Barkhausen effect in the alternating magnetic field;

determining as to whether the first person is allowed to pass through the passage or not, based on information indicating the detection signal by the detecting device and information obtained from the first reading device; and opening or closing, by a first opening and closing device, the passage for the first person, based on the determined result as to the first person; and a baggage exiting management method comprising:

reading, by a second reading device, personal information of a second person who passes through the passage to exit from the management region in which the baggage is managed;

generating, by the detecting device, the alternating magnetic field in the passage and detecting the variation in the alternating magnetic field when magnetization reversal occurs in the magnetic material due to the large Barkhausen effect in the alternating magnetic field;

determining as to whether the second person is allowed to pass through the passage, based on information indicating the detection signal by the detecting device and information obtained from the second reading device; and opening or closing, by a second opening and closing device, the passage for the second person, based on the determined result as to the second person.

7. The baggage management method according to claim 6 further comprising:

detecting the passing of a person (i) after reading, by the first reading device, the personal information of the first person or (ii) after reading, by the second reading device, the personal information of the second person.

8. The baggage management method according to claim 6, further comprising:

wherein determining as to whether the first person is allowed to enter the management region or not includes, determining as to whether the first person is allowed to enter the management region or not with reference to information indicating a clock when the first person passes a baggage management gate, and determining as to whether the second person is allowed to exit the management region or not includes, determining as to whether the second person is allowed to exit the management region or not with reference to information indicating a clock when the second person passes the baggage management gate.

9. The baggage management method according to claim 6, wherein in order away from the region in which the baggage is managed, (i) the first reading device, (ii) the second opening and closing device, (iii) the detecting device for both the first person and the second person, (iv) the first opening and closing device, and (v) the second reading device are arranged in an entrance direction from the passage to the management region in which the baggage is managed.

* * * * *